United States Patent
Chen et al.

(10) Patent No.: US 8,139,654 B2
(45) Date of Patent: Mar. 20, 2012

(54) DEVICE AND METHODS FOR BIPHASIC PULSE SIGNAL CODING

(75) Inventors: Du Chen, Dallas, TX (US); John G. Harris, Gainesville, FL (US); Jose C. Principe, Gainesville, FL (US)

(73) Assignee: University of Florida Research Foundation, Gainesville, FL (US)

( * ) Notice: Subject to any disclaimer, the term of this patent is extended or adjusted under 35 U.S.C. 154(b) by 1061 days.

(21) Appl. No.: 12/063,099

(22) PCT Filed: Aug. 8, 2006

(86) PCT No.: PCT/US2006/030886
§ 371 (c)(1),
(2), (4) Date: Feb. 6, 2008

(87) PCT Pub. No.: WO2007/019498
PCT Pub. Date: Feb. 15, 2007

(65) Prior Publication Data
US 2008/0192841 A1    Aug. 14, 2008

Related U.S. Application Data

(60) Provisional application No. 60/706,415, filed on Aug. 8, 2005.

(51) Int. Cl.
*H04L 27/00* (2006.01)
(52) U.S. Cl. ...................................................... 375/259
(58) Field of Classification Search .................. 375/259, 375/242, 243, 254; 320/132; 340/511
See application file for complete search history.

(56) References Cited

U.S. PATENT DOCUMENTS

| | | | |
|---|---|---|---|
| 2,375,575 A | 5/1945 | Morland et al. | |
| 3,946,745 A | 3/1976 | Hsiang-Lai et al. | |
| 4,138,982 A * | 2/1979 | Hattori et al. | 123/406.66 |
| 4,237,899 A | 12/1980 | Hagfors et al. | |
| 4,256,116 A | 3/1981 | Meretsky et al. | |
| 4,450,435 A * | 5/1984 | James | 340/511 |
| 4,472,680 A * | 9/1984 | Wellington | 324/221 |
| 4,994,807 A | 2/1991 | Hobbs | |
| 5,036,850 A | 8/1991 | Owens | |
| 5,172,117 A | 12/1992 | Mills et al. | |

(Continued)

FOREIGN PATENT DOCUMENTS
DE    196 53 566 A1    7/1998
(Continued)

OTHER PUBLICATIONS
International Search Report and Written Opinion, dated May 2, 2007.
(Continued)

*Primary Examiner* — Jaison Joseph
(74) *Attorney, Agent, or Firm* — Thomas, Kayden, Horstemeyer & Risley, LLP

(57) ABSTRACT

A method for coding time signals based on generating an asynchronous biphasic pulse train is provided. The method includes generating response signals based upon one or more input signals. A pulse comprises a positive pulse if a voltage of the response signal is greater than a predetermined positive voltage threshold. A pulse comprises a negative pulse if the voltage of the response signal is less than a predetermined negative voltage threshold. The method further includes a method for the reconstruction of a uniformly sampled version of the original signal.

14 Claims, 10 Drawing Sheets

U.S. PATENT DOCUMENTS

| | | | |
|---|---|---|---|
| 5,601,614 A * | 2/1997 | Ekwall | 607/25 |
| 6,285,164 B1 * | 9/2001 | Noda et al. | 320/132 |
| 6,369,730 B1 | 4/2002 | Blanke et al. | |
| 6,778,858 B1 | 8/2004 | Peeters | |
| 2001/0016013 A1 | 8/2001 | Feher | |
| 2002/0067740 A1 | 6/2002 | Vestal et al. | |
| 2002/0071484 A1 | 6/2002 | Spichale | |
| 2002/0118765 A1 | 8/2002 | Nangia et al. | |
| 2002/0131382 A1 | 9/2002 | Kim et al. | |
| 2002/0161310 A1 | 10/2002 | Daum | |
| 2003/0081610 A1 | 5/2003 | Bharucha et al. | |
| 2004/0068301 A1 | 4/2004 | Waltman et al. | |
| 2004/0138776 A1 | 7/2004 | Baumann et al. | |
| 2004/0156325 A1 | 8/2004 | Perkins et al. | |
| 2004/0167586 A1 | 8/2004 | Overstreet | |
| 2004/0172100 A1 | 9/2004 | Humayun et al. | |
| 2004/0186521 A1 | 9/2004 | Rubin et al. | |
| 2004/0213052 A1 | 10/2004 | Ware et al. | |
| 2004/0220645 A1 | 11/2004 | Freed et al. | |
| 2005/0007151 A1 | 1/2005 | Nystrom et al. | |
| 2005/0015473 A1 | 1/2005 | Teowee et al. | |
| 2005/0021307 A1 | 1/2005 | Schneider et al. | |
| 2005/0021326 A1 | 1/2005 | Schuijers et al. | |
| 2005/0021329 A1 | 1/2005 | Lin et al. | |
| 2005/0046610 A1 | 3/2005 | Zaugg | |
| 2005/0058188 A1 | 3/2005 | Lorenz | |
| 2005/0131473 A1 | 6/2005 | Gordon et al. | |
| 2005/0190865 A1 * | 9/2005 | Lazar et al. | 375/340 |
| 2006/0145909 A1 * | 7/2006 | Gupta et al. | 341/164 |
| 2007/0008046 A1 * | 1/2007 | Godambe | 331/135 |
| 2009/0292336 A1 * | 11/2009 | Nishida et al. | 607/45 |
| 2010/0081958 A1 * | 4/2010 | She | 600/544 |

FOREIGN PATENT DOCUMENTS

| | | |
|---|---|---|
| DE | 19653566 A | 7/1998 |
| WO | 2004039021 A1 | 5/2004 |
| WO | 2004112298 A1 | 12/2004 |

OTHER PUBLICATIONS

Bugman: "Summation and Multiplication: Two Distinct Operation Domains of Leaky Integrate-and-Lire Neurons," Internet Article, 1991; http://ej.iop.org/links/rLAdfyKLW/Zn7-Dy-m2xGLv06eav5vpA/ne910410.

Glover, et al., "Analogue VLSI leaky integrate-and-fire Neurons and Their Use in a Sound Analysis System," http://www.cs.stir.ac.uk/{lss/recentpapers/kluwer2002.ps>.

Schultz, et al., "Analogue VLSI 'Integrate-And-Fire' Neuron with Frequency Adaptation," Electronics Letters, IEEE Stevenage, GB, vol. 31, No. 16, Aug. 3, 1995, pp. 1357-1358.

Pean, et al., "Asynchronous Sequential Stimulation. A New Signal Treatment for Cochlear Implants," Ann Otolaryngol Chir Cervicofac. 1997; 114(5): pp. 184-190.

Litvak, et al., "Auditory Nerve Fiber Responses to Electric Stimulation: Modulated and Unmodulated Pulse Trains," J. Acoust. Soc. Am. Jul. 2001, 110(1), pp. 368-379.

Takahashi, et al., "Ultrafast All-Optical Serial-to-Parallel Conversion and Its Application to Optical Label Processing," Optical Review, Mar./Apr. 2004, vol. 11, Issue 2, p. 98.

Chasovsky, et al., "Digital System of Asynchronous Pulse Noise Cancellation," Telecommunications & Radio Engineering, 2003, vol. 59, Issue 1/2, p. 151.

Zha, et al., "Multiuser Receivers That Are Robust to Delay Mismatch," IEEE Transactions on Communications; Dec. 2002, vol. 50, Issue 12, p. 2072.

Haycock, et al., "Design of a Pulse Stream Neural Network," Circuits and Systems, 1997, 1053-1056, vol. 2.

Maundy, et al., "SC Implementation of Asynchronous Pulse Arithmetic in Artificial Neural Networks," Circuits and Systems, 1991, IEEE International Symposium, Jun. 11-14, 1991.

Roza, "Analog-to-Digital Conversion Via Duty-Cycle Modulation," Circuits and Systems II: Analog and Digital Signal Processing, IEEE Transactions, vol. 44, Issue 11, Nov. 1997.

* cited by examiner

DEVICE AND METHODS FOR BIPHASIC PULSE SIGNAL CODING

CROSS-REFERENCE TO RELATED APPLICATIONS

This application is a §371 national stage entry of International Application No. PCT/US2006/030886, filed Aug. 8, 2006, which claims the benefit of U.S. Provisional Application No. 60/706,415, filed Aug. 8, 2005, both of which are hereby incorporated by reference.

FIELD OF THE INVENTION

The present invention is related to the field of electronic signal processing, and, more particularly to pulse signal coding.

BACKGROUND OF THE INVENTION

Recorded sensor signals of many electronic devices, including implanted medical devices and remote sensors, are analog in nature, but post-recordation processing of the signals is typically performed using digitally based algorithms. Thus, the analog signals must frequently be converted into digital form prior to applying signal processing algorithms. Digital signals provide other advantages relative to analog signals. For example, digital signals are generally more robust to transmit and typically can be more readily stored electronically. Accordingly, many if not most devices that record analog signals also include some type of analog-to-digital (A/D) converter.

Many data acquisition devices, however, are severely constrained in terms of available power and available bandwidth. Therefore, the use of a power-consuming A/D converter can be a further constraint on the performance of such devices. For example, a limitation regarding A/D converters belonging to the widely-used Nyquist-Rate class of converters, which are characterized by a one-to-one correspondence between an output value and a single input value, is their power consumption. Moreover, when scaled to submicron size, high-resolution analog circuits are affected by low-power supply and poor transistor output resistance, the latter effect being due to the well-known body effect. Thus, a continuing challenge for designers is how to decrease power consumption in devices that record analog signals but perform signal processing digitally.

One solution is to utilize Delta-Sigma converters, which relax requirements for analog circuitry at the expense of more complicated digital circuitry. The underlying principle of Delta-Sigma converters is a sacrifice of resolution in amplitude for resolution in time in such a way that the imprecision of analog circuits can be tolerated. Yet the high resolution in time typically requires a high-speed clock, which results in high power consumption and increased complexity in the digital circuitry employed. Moreover, Delta-Sigma converters tend not to be well suited for systems such as implanted neural recording devices given the typical power and die area constraints often imposed on such devices.

The diminished suitability of Delta-Sigma converters stems from certain unique features of signals such as neural action potentials and speech signals. These types of signals generally exhibit non-stationary properties. With respect to speech, there typically are significant lags between the emission of information-carrying signals and information-free signals, reflecting the often frequent, often lengthy pauses between speech utterances during a conversation. There is generally no need for signal sampling during such lags and pauses, yet conventional systems and devices such as the Nyquist-Rate converter nonetheless continue to expend power operating even when the input signal does not contain useful information.

In the neuronal context, an integrate-and-fire (IF) signal representation mechanism entails passing a regulated analog signal through an IF neuron. The information is losslessly encoded into asynchronous pulse trains fired from the neuron according to specific threshold settings. The pulse train is compatible with digital logic circuits for subsequent processes. This coding method has the advantages of low-power consumption and simpler front-end circuitry, but the analog signal typically must be made strictly positive by adding a DC bias. Overall power will be wasted since the signal has to be shifted up by a worst-case offset, which is the most negative signal value possible during operation of the device.

A problem with this approach is that the DC bias tends to continuously produce spikes in the signal even when the original signal is in an idle state during which there is no useful information conveyed by a sensed signal. Additionally, the DC bias results in an average firing rate that is larger than the Nyquist rate. With some modifications to existing architecture, the DC bias can be eliminated by employing two IF neurons that encode positive and negative signals, respectively. Accordingly, the IF neurons do not respond to the signal when its value is zero. However, an additional problem of the IF signal representation is that the peak firing rate is unbounded. The system could spike at rates that are much larger than the minimum firing rate for perfect reconstruction. The extra pulses lead to wasted power consumption, wasted data bandwidth, and further problems in multiplexing the data off-chip. This peak spiking rate can be reduced with the addition of a neural refractory period wherein after a neuron fires it is disabled for a period of time. This results in the peak firing rate being limited by the inverse of the refractory period.

SUMMARY OF THE INVENTION

The invention provides a mechanism for encoding time signals in a manner that can overcome limitations inherent in conventional devices used to record analog signals and process such signals digitally. One aspect of this mechanism is a unique sampling technique that is based on asynchronous biphasic pulses.

The signal coding technique based on asynchronous biphasic pulses, according to the invention, performs a transformation of signals from the continuous-amplitude, continuous-time domain to a digital domain in which amplitude and time are discrete or quantized. The technique effects a unique division of encoding and decoding complexity in the operation and circuitry used for signal coding. More particularly, the asynchronous biphasic technique reduces front-end coding complexity, while enhancing signal reconstruction or decoding complexity at the back-end. The technique has particular applicability to applications that utilize power-restricted bandwidth channels. These applications include remote sensing and bio-signal recording, such as neural and speech recording, which in many circumstances are implemented with front-end circuitry that is characterized by ultra-low power requirements.

An output generated using the technique of the invention is an asynchronous biphasic pulse train. The asynchronous biphasic pulse train generated according to this technique can be transmitted more robustly relative to analog signals since the former consist of asynchronous digital pulses. This technique can lessen or eliminate a need for conventional power-intensive A/D converters.

Another aspect of the invention is the reconstruction of the original analog signal, which, as also described herein, can be reconstructed from the relatively noise-free pulse timings that comprise the asynchronous biphasic pulse train. In effect, the technique provides a more sophisticated signal reconstruction algorithm in order to utilize simpler, lower power consuming, less noise influenced front-end circuitry.

A particular advantage of the technique is that is it can reduce data bandwidth needed for signal transmission. This can be especially beneficial in the context of biomedical implants, for example, where the maximum data rate is limited by substantial attenuation through the overlying tissue and/or skin. Another advantage is that the technique allows the sampling rate to be reduced whenever the input signal exhibits low amplitude—typically due to noise in the absence of an information-carrying signal—while maintaining a high sampling rate for input signals exhibiting high amplitude, which is characteristic of signals that convey information. Yet another advantage is provided by the introduction, according to one aspect of the invention, of a refractory period. The introduction enables the bounding of the peak data rate to make sampling more manageable. A lower data rate per channel, moreover, allows more channels to be simultaneously recorded.

One embodiment of the invention is a device for coding time signals based on an asynchronous biphasic pulse train. The device can include an integrator for generating a response signal by integrating an electrical current input supplied to the device. The device also can include a first comparator for generating a positive pulse if a voltage of the response signal is greater than a predetermined positive voltage threshold. The device further can include a second comparator for generating a negative pulse if a voltage of the response signal is less than a predetermined negative voltage.

Another embodiment of the invention is a method of coding time signals based on generating an asynchronous biphasic pulse train. The method can include generating a plurality of response signals based upon at least one input signal. The method further can include generating a first and a second pulse; the second pulse being generated after the first pulse is generated. The time between the pulses can be used to encode the sign of the pulse whether the integrated signal triggered either the positive or negative voltage. The coding can easily be extended such that the time between pulses also encodes the channel number in a multichannel system.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION

The invention provides for the coding of time signals using a unique sampling technique. The sampling technique of the invention, more particularly, is based on asynchronous biphasic pulses. As used herein, the term biphasic refers generally to a system that encodes two different discrete events. The term pulse refers generally to a signal that exhibits a rapid fixed height, fixed width change-and-return sequence. The signal coding technique based on asynchronous biphasic pulses transforms signals from the continuous-amplitude, continuous-time domain to a series of biphasic pulses which are discrete in amplitude but continuous in time. After transmission, the timing of the pulses can be quantized to an integer multiple of a digital clock period.

Figure 1:
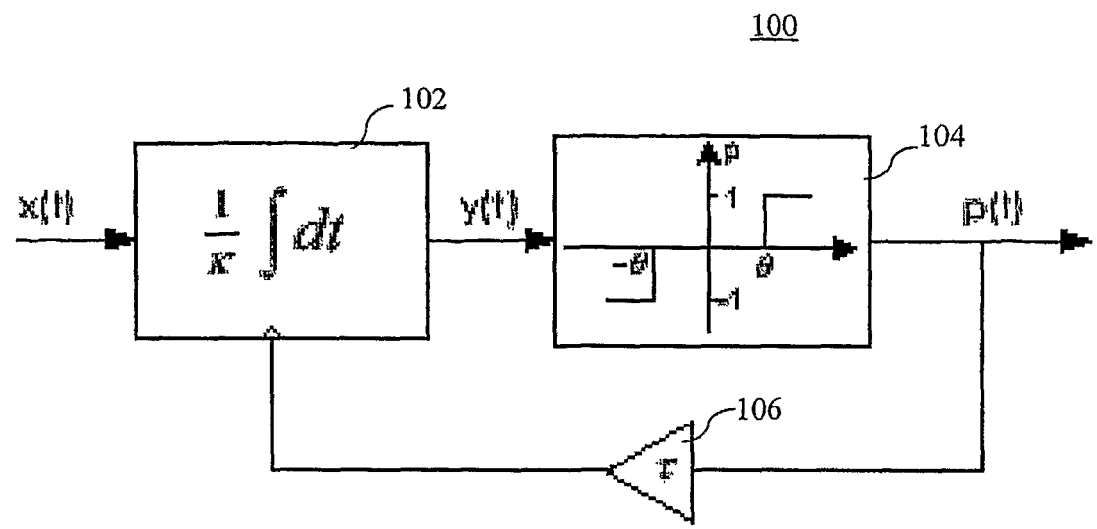
FIG. 1 is a schematic diagram of a device for coding time signals based on an asynchronous biphasic pulse train, according to one embodiment of the invention.

Referring initially to FIG. 1, a device 100 for coding time signals based on an asynchronous biphasic pulse train according to one embodiment of the invention illustratively includes an integrator 102 having an input for receiving an input signal, x(t). The device 100 further illustratively includes a comparator 104 that is connected to an output of the integrator 102, the comparator having an input to receive an output, y(t), generated by the integrator. The output of the comparator 104 is a pulse, p(t), the specific characteristics of which are described more particularly below. The pulse output of the comparator 104 provides the asynchronous biphasic pulses that are the basis of the signal coding effected by the device 100. Illustratively, the device 100 further includes a feedback loop from the output of the comparator 104 to the integrator 102; a buffer 106, as shown, is interposed in the feedback loop.

The biphasic sampling scheme of the invention is implemented by the integrator 102 initially integrating the input signal, x(t), to thereby generate the aforementioned output, y(t). The output, y(t), defines a response signal that is generated in response to the input signal, x(t). More particularly, the input signal, x(t), can comprise an electrical current, and accordingly, the response signal, y(t), is generated by integrating the electrical current. If a resulting voltage level of the response signal y(t) is above a predefined threshold voltage, θ, then the pulse, p(t), that comprises the output of the comparator 104 increases. The pulse, p(t), is also fed back to the integrator 102, albeit after a delay, τ, which is induced by the delay buffer 106. After a relatively slight delay, the feedback resets the integrator 102.

Conversely, if the voltage level of the output, y(t), of the integrator 102 is less than a predefined lower threshold, then the output p(t) of the comparator 104 decreases. This second threshold can be, for example, the additive inverse, −θ, of the first threshold or some other lower threshold. Again, after a delay, τ, induced by the delay buffer 106, the feedback of the output, p(t), of the comparator 104 to the integrator 102 resets the integrator. Once reset, the output of the integrator, y(t), returns to zero, and the output of the comparator 104 likewise goes to zero.

As time continues, if further input signals, x(t), are supplied to the input of the integrator 102, the described events repeat. Thus are generated the biphasic pulses that comprise the biphasic pulse train on which the coded signals are based. The information conveyed by the input signals is encoded into the time intervals between pulses. The encoding, more particularly, can be based on the design parameters κ and θ. Note that the timing of two consecutive pulses $t_i$, and $t_{i+1}$ satisfies the following constraint:

$$\frac{1}{\kappa}\int_{t_i+2\tau}^{t_{i+1}} x(\tau)d\tau = \theta_i,$$

where $\theta_i \in \{-\theta, \theta\}$. Assuming the pulse width, or refractory period, corresponding to τ is much less than the time interval between pulses, the output at time t, p(t), is:

$$p(t) = \sum_{i \in Z} \text{sign}(\theta_i)\delta(t-t_i),$$

where sign(·) is the signum function.

A result of the operations performed is that signed signals can be encoded such that low amplitude noise is largely ignored; low amplitude noise can remain at an approximately zero DC level. The encoding, as alluded to already, can be particularly effective for encoding signals based on IF neurons because low-level noise corresponds closely to an IF neuron being at rest.

Figure 2:
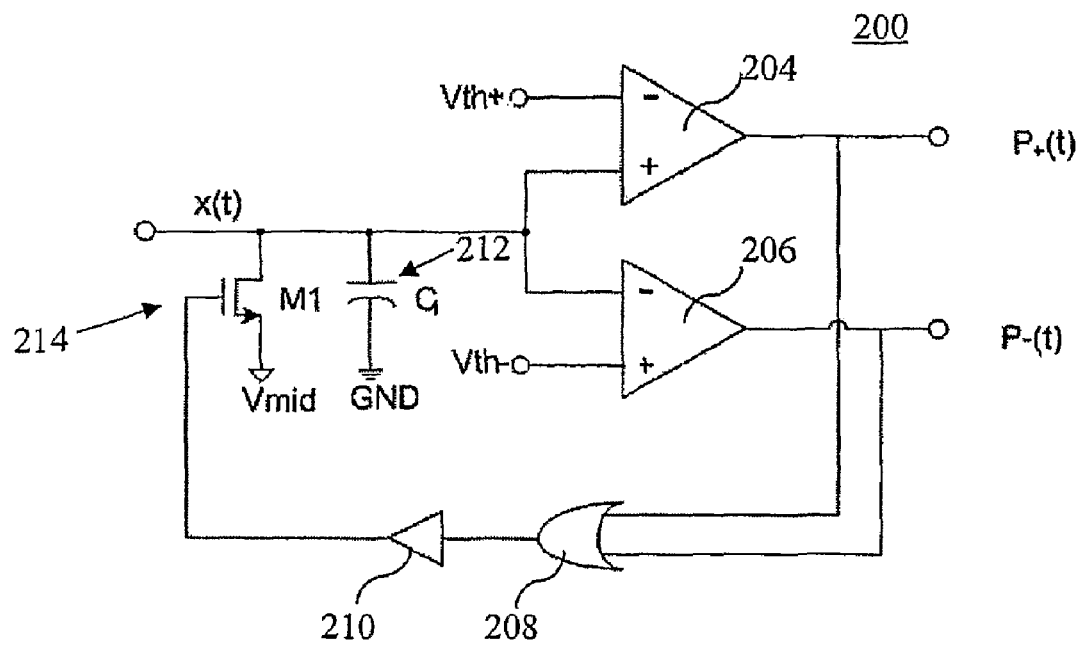
FIG. 2 is a schematic diagram of an electronic circuit for coding time signals based on an asynchronous biphasic pulse train, according to another embodiment of the invention.

FIG. 2 provides a schematic diagram of an electronic circuit 200 for implementing the biphasic sampling scheme of the invention, according to another embodiment of the invention. The circuit 200 illustratively includes two separate comparators, a first comparator 204 and a second comparator 206. The circuit 200 also illustratively includes a two-input logic gate 208 having a first input that is illustratively connected to the output of the first comparator 204 and a second input that is connected to the output of the second comparator 206. A delay buffer 210 is illustratively connected to the output of the logic gate 208.

The circuit 200 further includes an integrator comprising a single capacitor 212. The capacitor 212 is connected to a non-inverting input of the first comparator 204 and to an inverting input of the second comparator 206. The capacitor 212 is also connected to the input at which an input signal is received into the circuit 200. Additionally, the circuit 200 illustratively includes a switch, the switch comprising a field-effect transistor (FET) 214. The FET 214 also is connected to the non-inverting input of the first comparator 204 and to the inverting input of the second comparator 206, as well as to the input for receiving an input signal.

Operatively, the integrator 212 generates a response signal by integrating an electrical current input supplied to the input of the circuit 200. If a voltage of the response signal is greater than a predetermined positive voltage threshold, the first comparator 204 generates a positive pulse. If the voltage of the response signal is less than a predetermined negative voltage, then the second comparator 206 generates a negative pulse.

The outputs of both the first and second comparators 204, 206 are fed back to a gate of the FET 214 through the logic gate 208. The logic gate 208, more particularly, is an OR gate, which conveys a signal to the gate of the FET 214 only if there is an output at either the first or second comparators 204, 206. Although the OR gate will convey a signal when there is an output of both comparators, the occurrence of simultaneous outputs at the two comparators is precluded in this circuit since a response signal can not be both above the positive voltage threshold and below the negative voltage threshold.

When the logic gate 204 supplies a control signal to the gate of the FET 214, the FET conducts current, allowing the capacitor 212 to discharge. This is functionally equivalent to the previously described resetting of an integrator after a pulse is generated at the output a comparator. As already noted, the conveyance of the signal from the output of either of the comparators 204, 206 to the gate of the FET 214 is delayed by the delay buffer 210. The delay can be set to ensure that width, or refractory period, of each pulse is less than the time interval between successive pulses.

Another aspect of the invention is recovery of the original analog signal that comprises the input from which the encoded signals are derived according to the biphasic encoding technique already described. In particular, a bandlimited analog signal x(t) can be reconstructed from the pulse train p(t) and based on the given threshold θ.

Signal Reconstruction Iterative Algorithm

In the context of signal reconstruction, the input signal x=x(t), t ∈R, to be reconstructed is assumed to be a bounded signal bandlimited to {−ω, ω}. The timing sequence of the pulse train output is given as $\{t_n, n \in Z\}$, where Z is the set of integers. An iterative algorithm for signal reconstruction uses the sinc function, $$h(t) = \frac{\omega}{\pi}\text{sinc}(\omega t),$$

$s_i = (t_{i+1}+t_i)/2$. Additionally, $\delta = \sup_{n \in Z}(t_{i+1}-t_i) < \pi/\omega$, and $$\int_{t_i}^{t_{i+1}} x(\tau)d\tau = \theta_i, \text{ where } \theta_i \in \{-\theta, \theta\}.$$

Using the sinc functions and these values, the signal x(t) is uniquely determined by the timing sequence $t_i$ and $\theta_i$. The algorithm for signal reconstruction, therefore, is the following:

Set the initial condition to be $$x_0 = \sum_{i \in Z} \theta_i h(t-s_i),$$

and solve the recursive relationship $$x_{l+1} = x_l + x_0 - \sum_{i \in Z} \int_{t_i}^{t_{i+1}} x_l(\tau)d\tau h(t-s_i).$$

It can be shown that $$x(t) = \lim_{t \to \infty} x_l \text{ and } \|x - x_l\| \le \left(\frac{\delta \omega}{\pi}\right)^{l+1} \|x\|.$$

This result can be shown using the following theorem:

Theorem 1. Let $x=x(t)$, where $t \in R$, be a bounded signal bandlimited to $[-\omega, \omega]$. Moreover, the timing sequence of the output pulse train is $\{t_n, n \in Z\}$. $\delta = \sup_{n \in z}(t_{i+1} - t_i) < \pi/\omega$. Let $$h(t) = \frac{\omega}{\pi} \text{sinc}(\omega t), \quad s_i = \frac{(t_{i+1} + t_i)}{2}, \text{ and } \int_{t_i}^{t_{i+1}} x(\tau) d\tau = \theta_i,$$

where $\theta_i = \{\omega, \omega\}$. If the initial condition is $$x_0 = \sum_{i \in Z} \theta_i h(t - s_i)$$

and if the recursive relationship $$x_{l+1} = x_l + x_0 - \sum_{i \in Z} \int_{t_i}^{t_{i+1}} x_l(\tau) d\tau h(t - s_i)$$

is solved, the $x(t)$ is uniquely determined by the timing sequence $t_i$ and $\theta_i$ by the described iterative algorithm. Proof. Let the operator A be $$Ax = \sum_{i \in Z} \int x(\tau) d\tau(t - s_i),$$

and set $x_0 = Ax$. Therefore, the above recursive relationship can be rewritten as follows:

$$x_{l+1} = x_l + x_0 - Ax_l = \sum_{k=0}^{l+1} (Id - A)^k Ax,$$

where Id is the identity operator.

Since the time interval between two consecutive pulse is bounded by $$\delta \le \frac{\omega}{\pi}$$

and $$\|Id - A\| \le \frac{\delta \omega}{\pi},$$

it follows that $|Id - A| \le 1$. This implies that A is invertible, and the inverse can be represented as a von Neumann series:

$$A^{-1} = \sum_{k=0}^{\infty} (Id - A)^k.$$

Thus $$\lim_{t \to \infty} x_l = \sum (Id - A)^k Ax = A^{-1} Ax = x(t).$$

From the earlier-stated inequality, $$\|Id - A\| \le \frac{\delta \omega}{\pi},$$

it follows that $$\|x - x_l\| = \left\| \sum_{k=0}^{\infty} (Id - A)^k Ax - \sum_{k=0}^{l} (Id - A)^k Ax \right\|$$
$$= \left\| \sum_{k=l+1}^{\infty} (Id - A)^k Ax \right\|$$
$$= \|(Id - A)^{l+1} Ax\|$$
$$= \left(\frac{\delta \omega}{\pi}\right)^{l+1} \|x\|.$$

Signal Reconstruction Refractory Period and Convergence

For more general cases, the algorithmic procedures for signal reconstruction can take into account the refractory period of the pulses. The delay owing to the feedback loop described above would seem intuitively to lead to information loss, but significant recovery of the signal is achieved if the following, restrictive condition is imposed:

$$\|Id - A\| \le \frac{\delta \omega}{\pi}(1 + \varepsilon) + \varepsilon,$$

where $$\varepsilon^2 = \Delta \Big/ \left(\frac{k\theta}{b+m} + \Delta\right),$$

$\Delta = 2\tau$. If $$\delta < \frac{(1-\varepsilon)\pi}{(1+\varepsilon)\omega},$$

$|Id - A| < 1$, then convergence is guaranteed. If $$\delta = \sup_{i \in Z}(t_{i+1} - t_i) < \frac{(1-\varepsilon)\pi}{(1+\varepsilon)\omega},$$

then the original signal can be recovered well based on the same initial condition and iteration algorithm. The convergence speed is $$\|x - x_l\| \le \left[\frac{\delta\omega}{\pi}(1+\varepsilon) + \varepsilon\right]^{l+1} \|x\|.$$

The proof of this result is similar to that presented above.

Signal Reconstruction Closed-Form Algorithm

The iteration can be replaced by a closed-form solution. Assume that $\theta=[\theta_i]$, $h=[h(t-s_i)]^T$, $$A_{ij} = \int_{t_j+\Delta}^{t_{j+1}} h(t-s_i)\,dt.$$

Accordingly, the initial condition is $x_0 = \theta h$, and $$x_{l+1} = \theta \sum_{k=0}^{l}(I-A)^k h.$$

This leads to the following closed-form for reconstructing the input signal, x(t):

$$x(t) = \lim_{l\to\infty} x_l = \theta \sum_{k=0}^{\infty}(I-A)^k h = \theta A^{-1} h.$$

Figure 3:
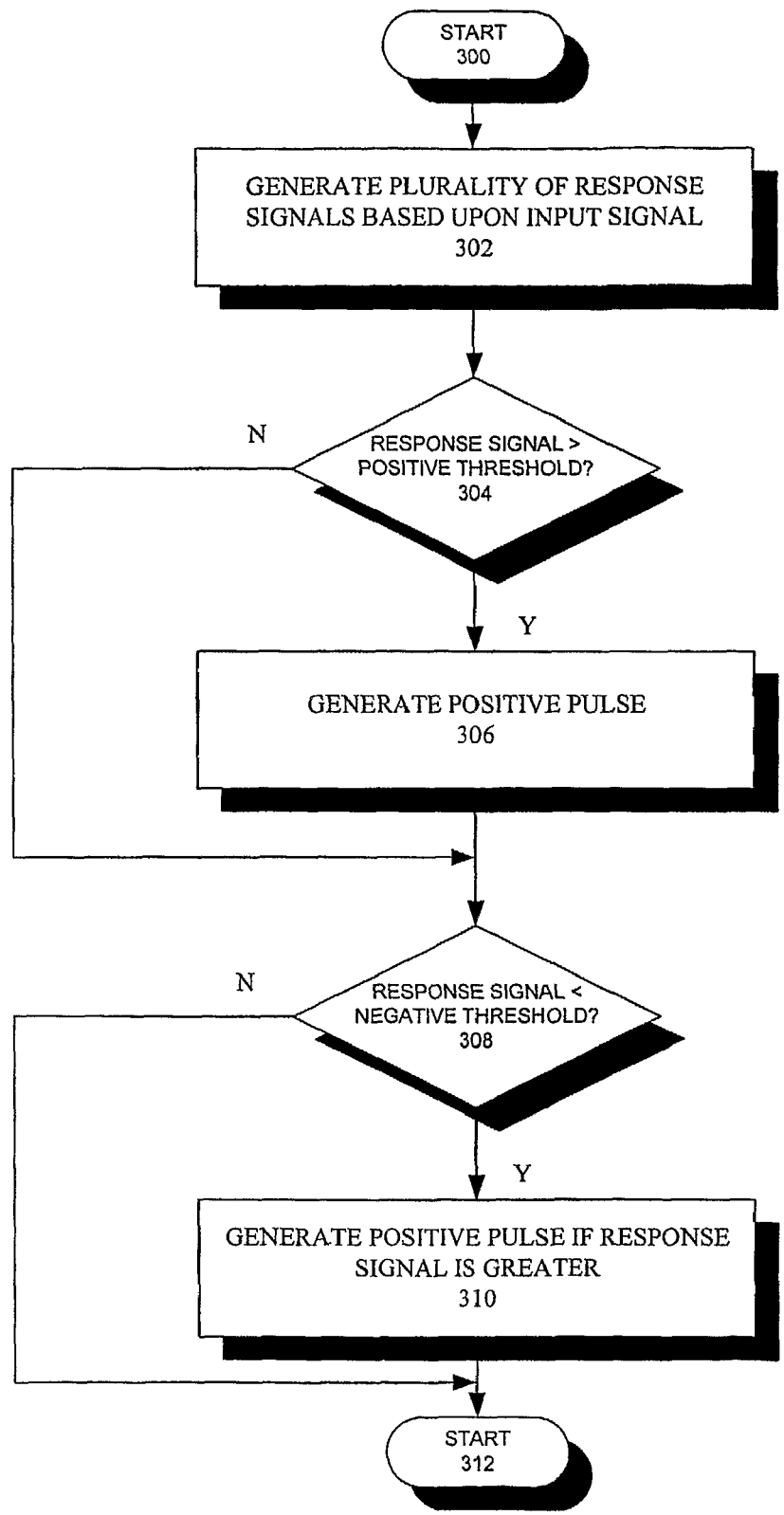
FIG. 3 is a flowchart of the exemplary steps of a method for coding time signals based on biphasic pulses, according to still another embodiment of the invention.

Another embodiment of the invention is a method of coding time signals based on generating an asynchronous biphasic pulse train, as illustrated by the flowchart of FIG. 3. The method 300 includes at step 302 generating a plurality of response signals based upon the input signal. At step 304, it is determined whether the response signal is above a positive threshold. If so, the method 300 continues with the generation of a positive pulse at step 306. Otherwise, at 308, it is determined whether the response signal is less than a negative threshold. If so, a negative pulse is generated at step 310. As soon as a pulse is generated, the response signal is reset back to an initial value at step 312. Steps 302-310 are repeated as needed to process more input signals. The method concludes at step 314.

EXAMPLES

Synthetic Signal Simulation

Figure 4A:
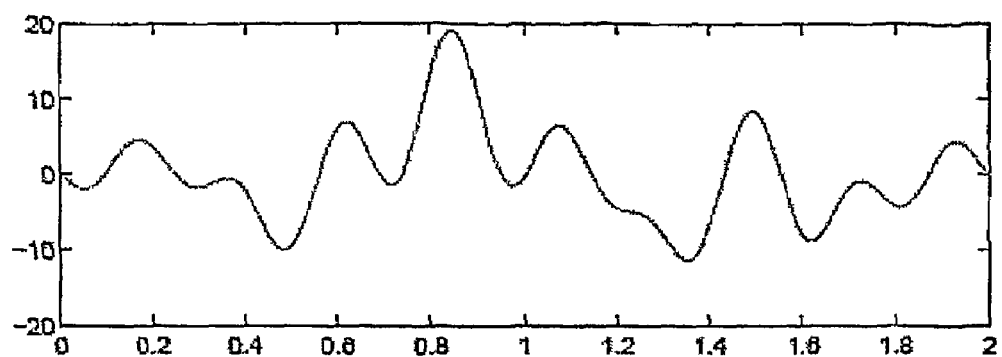
FIGS. 4(a) and 4(b) are plots, respectively, of an input signal and output pulse train simulating results obtained with one embodiment of the invention.
Figure 4B:
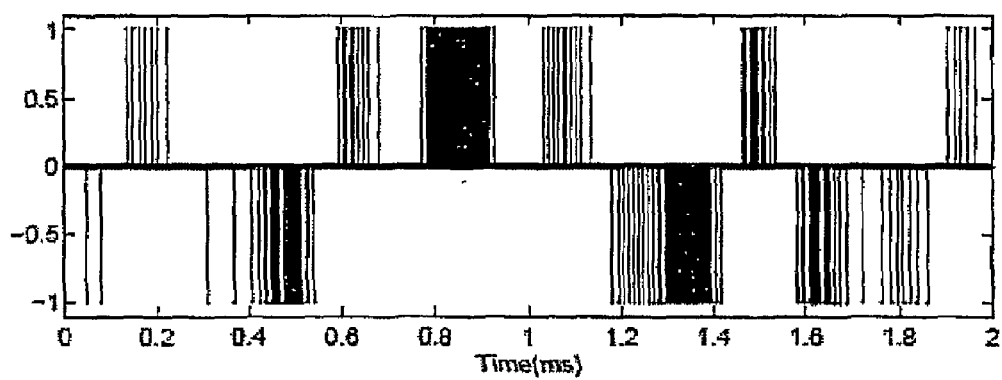
Figure 5A:
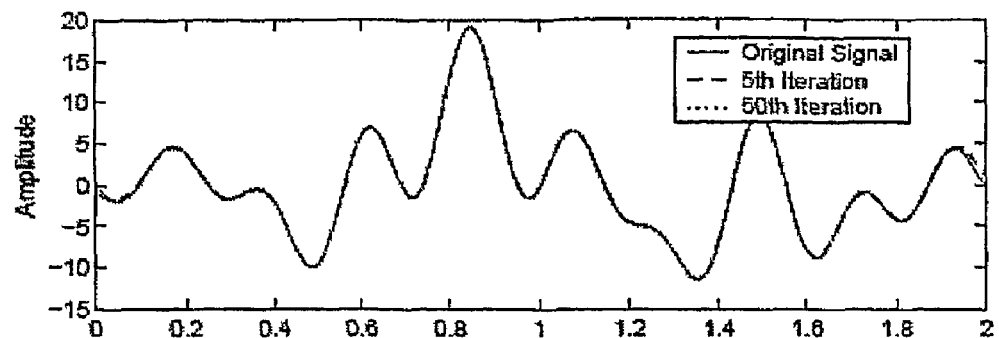
FIGS. 5(a) and 5(b) are plots, respectively, of a comparison between an original signal and iterative results, and errors between the original signal and iterative results obtained from the simulation of one embodiment of the invention.
Figure 5B:
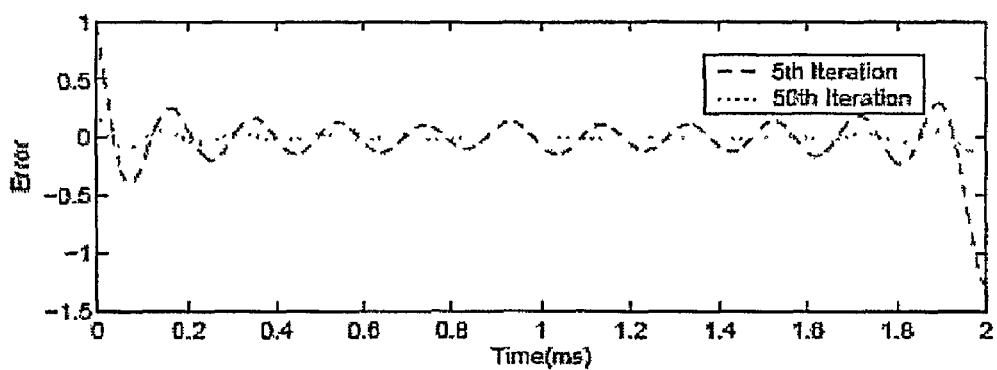

The invention can be demonstrated by the results of synthetic signal simulation, where the synthetic signal is defined as a superposition of admissible frequencies with random amplitude. In FIG. 4(a), the bandwidth of an input signal is 5 KHz. The threshold θ is $5.6 \times 10^{-5}$. The corresponding output pulse train with the maximum timer interval δ is 95.7 μs. The total number of pulses is 157. FIG. 5(a) shows the recovery results based on the above-described iterative algorithm. The error, in FIG. 5(b), is defined here as the difference between the original signal and the recovered signal:

$$e_l(t) = x(t) - x_l(t).$$

Figure 6:
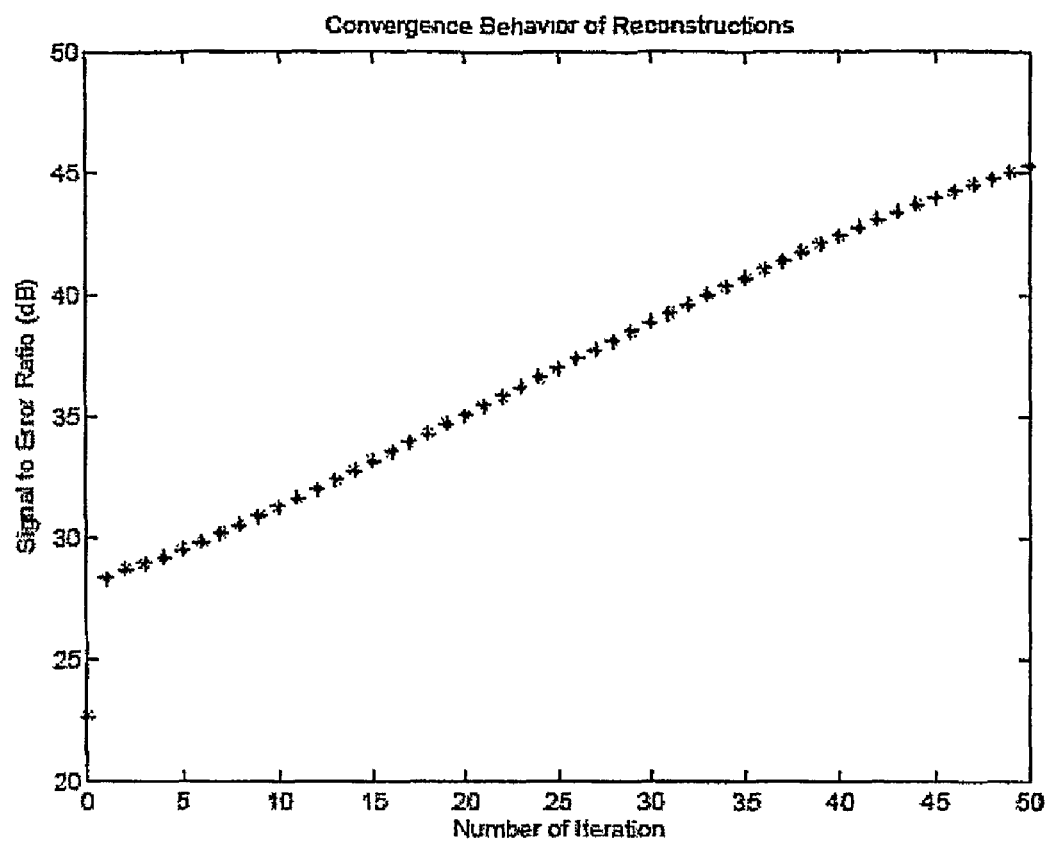
FIG. 6. is a plot of a signal-to-error ratio versus number of iterations demonstrating the convergence behavior of reconstructions obtained in the simulation of one embodiment of the invention.

The signal-to-error ratio (SER) is the power ratio between the original signal and the recovered signal. The SER can be used to evaluate the convergence performance. According to the previous equation for the error, the slope of the SER should be approximately equal to 0.38 dB per iteration. FIG. 6 demonstrates the agreement of the results with the estimated convergence speed.

As previously described, all of the derivations are based on an infinite length signal. Because the signal is truncated and quantized in the simulation, the inverse of the operator A is not guaranteed. In the simulation, therefore, the pseudo inverse as an approximation is used:

$$\hat{x}(t) = \theta A^+ h.$$

Figure 7A:
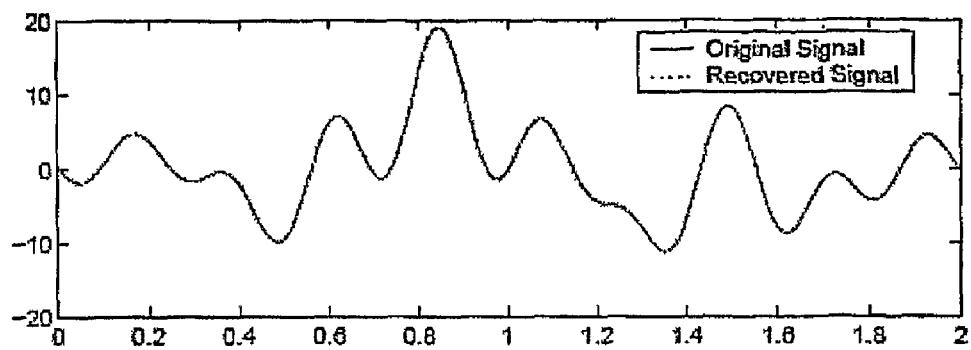
FIGS. 7(a) and 7(b) are plots, respectively, of a comparison between an original signal and recovered signal, and the absolute error obtained from the simulation of one embodiment of the invention.
Figure 7B:
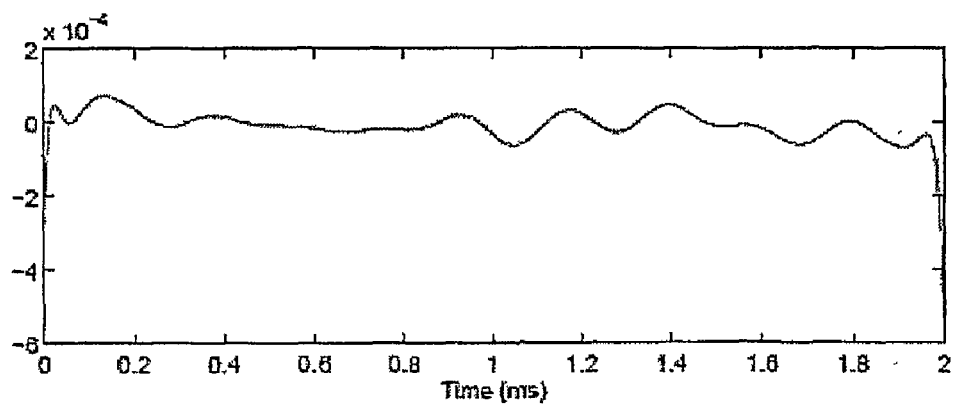

The error introduced by the truncation and finite precision in simulation is defined as $x - \hat{x}$. The recovered signal and corresponding error are shown in FIGS. 7(a) and 7(b) respectively. FIG. 7(a) is a comparison between the original signal and the recovered signal, and the absolute error obtained with the described simulation.

Neuron Action Potential

Application of the invention, and particularly the reconstruction algorithm, in the context of recorded neuron action potentials can also be demonstrated by simulation. Simulations of recorded neural data from the motor cortex of a rat demonstrate a significant reduction in the number of spikes for the same signal reconstruction performance. Furthermore, the techniques provided by the invention have the added advantage of dynamically reducing the sampling rate in regions of low input (typically noise) while maintaining a high sampling rate in regions of high input (typically the signal). Additionally, the biphasic system can be configured to perform an automatic data compression by using peak-rate spikes during neural spike events and much lower rates at other times.

Figure 8A:
FIGS. 8(a)-(d) are plots of a simulated reconstruction of signals in the context of recorded neural activity, according to another embodiment of the invention.
Figure 8B:
Figure 8C:
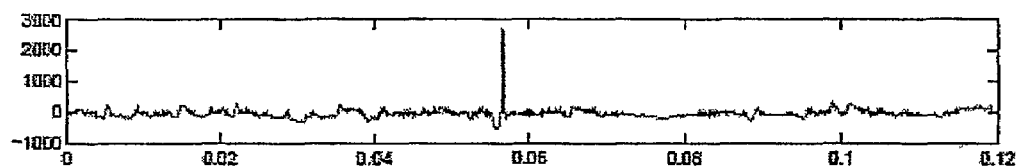
Figure 8D:
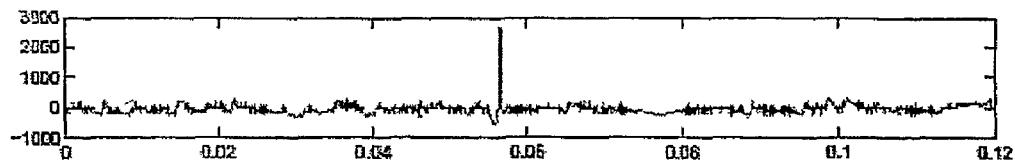
Figure 9A:
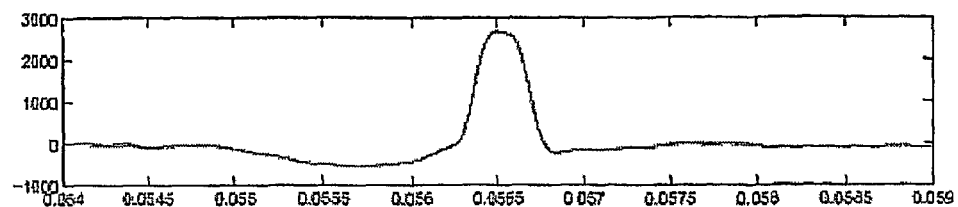
FIGS. 9(a)-(c) are additional plots of the simulated reconstruction of signals in the context of recorded neural activity, according to another embodiment of the invention.
Figure 9B:
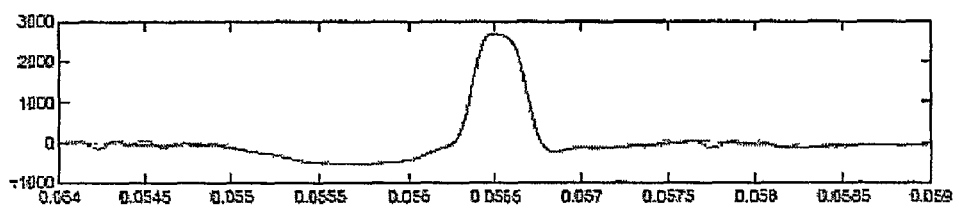
Figure 9C:
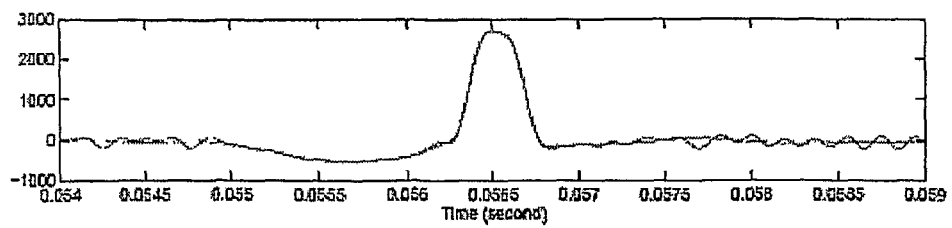

FIGS. 8(a)-(d) illustrate the compression effects for various spike rates. FIG. 8(a) is a plot of an original recording of neural data obtained using a laboratory rat sampled at 25 KHz with 16-bit resolution. FIGS. 8(b)-(d) are plots of the reconstructed signal using various compression rates achieved by varying the refractory period. Spike rates are 17.8 KHz, 9.2 KHz, and 6.1 KHz. As the spike rate decreases, the distortion in the signal is primarily in the noise regions, not in the spike region. This is verified in FIGS. 9(a)-(c), which provide zoom-in views of the spike waveforms themselves and shows that the reconstruction is preserved in the neural spike region.

Figure 10A:
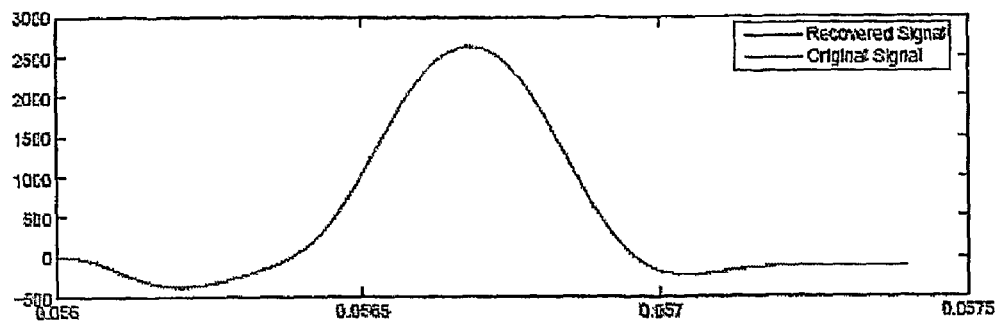
FIG. 10(a) and FIG. 10(b) provide, respectively, a comparison of the original signal versus the recovered signal, and a plot of the absolute error according to another embodiment of the invention.
Figure 10B:
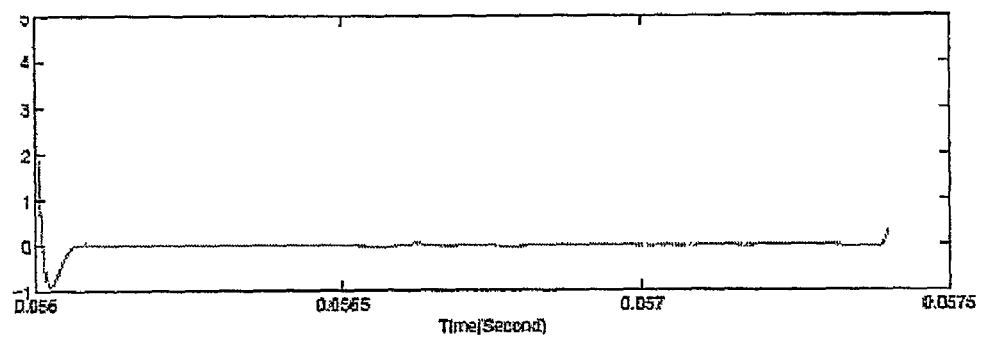

The spike waveform can be recovered more accurately by using the closed-form algorithm, described above. FIG. 10(a) provides a comparison of the original signal versus the recovered signal, and FIG. 10(b) is a plot of the absolute error. Calculations using the closed-form reconstruction algorithm on only the spike waveform yielded SER values as high as 89.1 dB with 17.8 KHz average fire rate. The reconstruction results from the output encoder are summarized in the following table:

| RECONSTRUCTION PERFORMANCE SUMMARY (30TH ITERATION) | | |
| --- | --- | --- |
| Average Fire Rate (sample/second) | SER (dB) | Neural Spike Range SER (dB) |
| 70.6K | 44.2 | 50.3 |
| 51.4K | 36.2 | 49.8 |

-continued

RECONSTRUCTION PERFORMANCE SUMMARY
(30TH ITERATION)

| Average Fire Rate (sample/second) | SER (dB) | Neural Spike Range SER (dB) |
|---|---|---|
| 40.5K | 33.2 | 43.2 |
| 17.8K | 21.1 | 42.6 |
| 9.2K | 15.2 | 41.5 |
| 6.1K | 11.3 | 33.1 |

The invention described herein can be realized in hardware, software, or a combination of hardware and software. The invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The invention can be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

This invention can be embodied in other forms without departing from the spirit or essential attributes thereof. Accordingly, reference should be made to the following claims, rather than to the foregoing specification, as indicating the scope of the invention.

We claim:

1. A method of coding time signals based on generating an asynchronous biphasic pulse train, the method comprising:
   generating a plurality of response signals based upon at least one input signal; and
   generating a series of pulses, wherein a pulse comprises a positive pulse if a voltage of the response signal is greater than a predetermined positive voltage threshold, and wherein a pulse comprises a negative pulse if the voltage of the response signal is less than a predetermined negative voltage threshold, and where generation of a subsequent pulse in the series of pulses is blocked for a predetermined time interval following generation of a previous pulse in the series of pulses, further comprising reconstructing the input signal received at time t based upon biphasic encoded data, the reconstruction being performed based upon an initial condition $$x_0 = \sum_{i \in Z} \theta_i h(t - s_i)$$

and a recursive relation $$x_{l+1} = x_l + x_0 - \sum_{i \in Z} \int_{t_i}^{t_{i+1}} x_l(\tau) d\tau h(t - s_i),$$

where each $t_i$ is an indexed time value, $\tau$ is a predetermined refractory period, $s_i = (t_{i+1} + t_i)/2$, and $h(t)$ is a sinc function, $$h(t) = \frac{\omega}{\pi} \text{sinc}(\omega t),$$

where $\omega$ is an angular frequency of the bandlimited bounded input signal.

2. The method of claim 1, wherein each input signal comprises an electrical current, and wherein generating a response signal based upon the input signal comprises integrating the electrical current.

3. The method of claim 1, wherein the first and second pulse are generated such that each has a pulse width defining a refractory period that is less than the interval between when the first pulse is generated and when the second pulse is generated.

4. The method of claim 1, wherein encoding comprises biphasic encoding based upon the predetermined positive and negative voltage thresholds and a predefined integrator constant.

5. A method of coding time signals based on generating an asynchronous biphasic pulse train, the method comprising:
   generating a plurality of response signals based upon at least one input signal: and
   generating a series of pulses, wherein a pulse comprises a positive pulse if a voltage of the response signal is greater than a predetermined positive voltage threshold, and wherein a pulse comprises a negative pulse if the voltage of the response signal is less than a predetermined negative voltage threshold, and where generation of a subsequent pulse in the series of pulses is blocked for a predetermined time interval following generation of a previous pulse in the series of pulses, further comprising compressing encoded time signals by generating pulses at a peak pulse rate whenever an input signal is above a minimum threshold and generating pulses at a pulse rate that is slower than the peak pulse rate otherwise.

6. The method of claim 5, wherein each input signal comprises an electrical current, and wherein generating a response signal based upon the input signal comprises integrating the electrical current.

7. The method of claim 5, wherein the first and second pulse are generated such that each has a pulse width defining a refractory period that is less than the interval between when the first pulse is generated and when the second pulse is generated.

8. The method of claim 5, wherein encoding comprises biphasic encoding based upon the predetermined positive and negative voltage thresholds and a predefined integrator constant.

9. A device for coding time signals based on an asynchronous biphasic pulse train, the device comprising:
   an integrator for generating a response signal by integrating an electrical current input supplied to the device;
   a first comparator for generating a positive pulse if a voltage of the response signal is greater than a predetermined positive voltage threshold;

a second comparator for generating a negative pulse if a voltage of the response signal is less than a predetermined negative voltage; and a reset circuit configured to reset the integrator a predetermined time interval after generation of a pulse by the first comparator or by the second comparator, wherein the reset circuit comprises a delay connected to an output of the first comparator and to an output of the second comparator for resetting the integrator if one of an output of the first comparator and an output of the second comparator is non-zero.

10. The device of claim 9, wherein the integrator comprises a capacitor connected at a first end to a non-inverting input of the first comparator and to an inverting input of the second comparator and connected at a second end to ground.

11. The device of claim 9, wherein the reset circuit comprises a logic gate connected to an output of the first comparator and to an output of the second comparator, and a delay buffer connected to an output of the logic gate.

12. The device of claim 11, wherein the reset circuit further comprises a switch connected to the delay buffer for blocking generation of a subsequent pulse during the predetermined time interval following generation of a previous pulse.

13. A system, comprising:

at least one computing device; and a time signal reconstruction application executable in the at least one computing device, the time signal reconstruction application comprising:

logic that obtains an asynchronous biphasic pulse train generated from a time signal received at time t; and logic that reconstructs the time signal received at time t based upon biphasic encoded data of the pulse train, the reconstruction being performed based upon an initial condition $$x_0 = \sum_{i \in Z} \theta_i h(t - s_i)$$

and a recursive relation $$x_{l+1} = x_l + x_0 - \sum_{i \in Z} \int_{t_i}^{t_{i+1}} x_l(\tau) d\tau h(t - s_i),$$

where each $t_i$ is an indexed time value, $\tau$ is a predetermined refractory period, $s_i = (t_{i+1} + t_i)/2$, and $h(t)$ is a sinc function, $$h(t) = \frac{\omega}{\pi} \text{sinc}(\omega t),$$

where $\omega$ is an angular frequency of the time signal.

14. The system of claim 13, wherein the time signal is a bounded signal bandlimited to $\{-\omega, \omega\}$.

* * * * *

UNITED STATES PATENT AND TRADEMARK OFFICE
CERTIFICATE OF CORRECTION

| | | |
|---|---|---|
| PATENT NO. | : 8,139,654 B2 | Page 1 of 1 |
| APPLICATION NO. | : 12/063099 | |
| DATED | : March 20, 2012 | |
| INVENTOR(S) | : Du Chen, John G. Harris and Jose C. Principe | |

It is certified that error appears in the above-identified patent and that said Letters Patent is hereby corrected as shown below:

Col. 1, lines 13-14, please insert:

--FEDERALLY-SPONSORED RESEARCH OR DEVELOPMENT

This invention was made with Government support under Grant #N66001-10-C-2008 awarded by the U.S. Department of Defense. The Government has certain rights in this invention.--

Signed and Sealed this
Twenty-ninth Day of May, 2012

David J. Kappos
*Director of the United States Patent and Trademark Office*